(12) United States Patent
Okuyama et al.

(10) Patent No.: US 7,695,314 B2
(45) Date of Patent: Apr. 13, 2010

(54) CONNECTOR MODULE

(75) Inventors: Takeshi Okuyama, Sunnyvale, CA (US); Haruna Morohoshi, Sunnyvale, CA (US); Mitsuru Kobayashi, Shinagawa (JP); Tadashi Kumamoto, Shinagawa (JP); Takahiro Kondou, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 11/237,710

(22) Filed: Sep. 29, 2005

(65) Prior Publication Data

US 2007/0072444 A1 Mar. 29, 2007

(51) Int. Cl.
*H01R 13/60* (2006.01)
*H01R 13/66* (2006.01)

(52) U.S. Cl. ............... 439/541.5; 439/607.23; 439/607.4

(58) Field of Classification Search ............. 439/541.5, 439/540.1, 620, 76.1, 607, 607.23–607.26, 439/607.34–607.4
See application file for complete search history.

(56) References Cited

U.S. PATENT DOCUMENTS 3,631,299 A * 12/1971 Meyer et al. ............... 361/752
5,167,530 A * 12/1992 Wallgren et al. .......... 439/540.1
5,545,057 A * 8/1996 Tan et al. ................. 439/540.1
5,759,067 A * 6/1998 Scheer ....................... 439/607
6,022,245 A * 2/2000 Minich ...................... 439/620
2006/0134984 A1* 6/2006 Korsunsky et al. .......... 439/607

FOREIGN PATENT DOCUMENTS

| JP | 9-6479 | 1/1997 |
| JP | 2002-42926 | 2/2002 |

* cited by examiner

*Primary Examiner*—Felix O Figueroa
(74) *Attorney, Agent, or Firm*—Staas & Halsey LLP

(57) ABSTRACT

A connector module that is mounted on a motherboard and is configured to realize connection between a cable side connector and the motherboard is disclosed. The connector module includes a printed circuit board, plural substrate side connectors that are mounted on the front surface of the printed circuit board and arranged into plural rows with differing heights, and a mounting connector that is mounted on the rear surface of the printed circuit board. At least one of the substrate side connectors is connected to the cable side connector. The mounting connector is engaged with and connected to a motherboard side connector that is mounted on the motherboard. The printed circuit board includes a pattern that is configured to realize electrical connection between the substrate side connectors and the mounting connector.

11 Claims, 17 Drawing Sheets

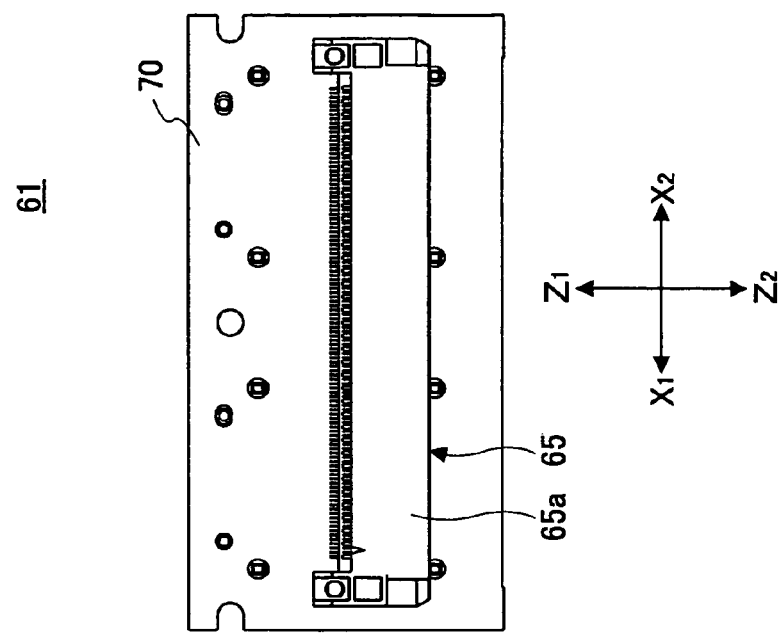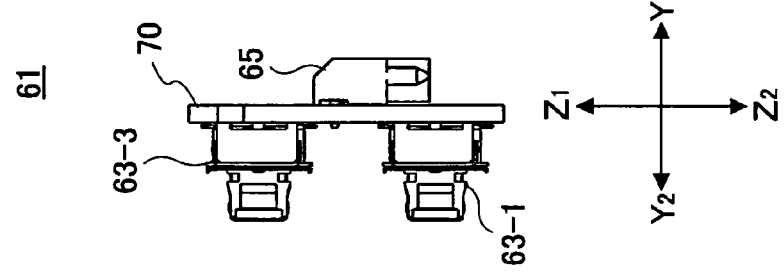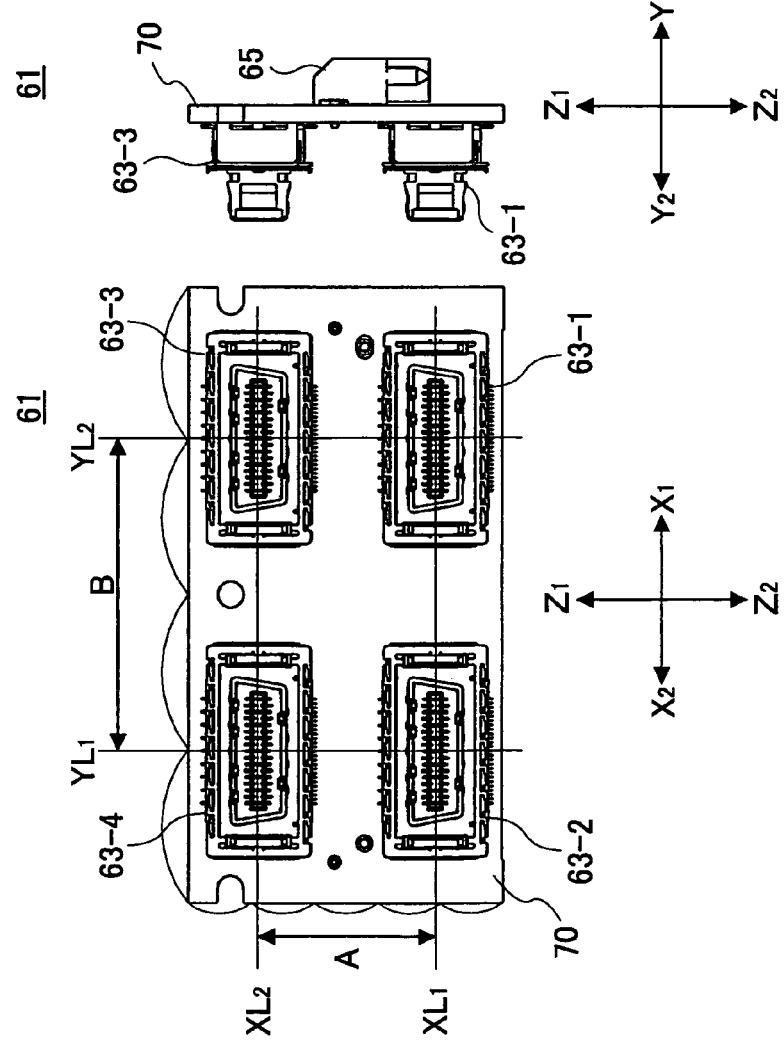

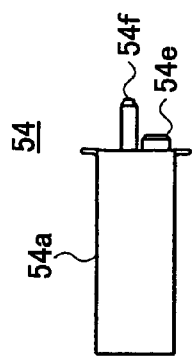
FIG.14D
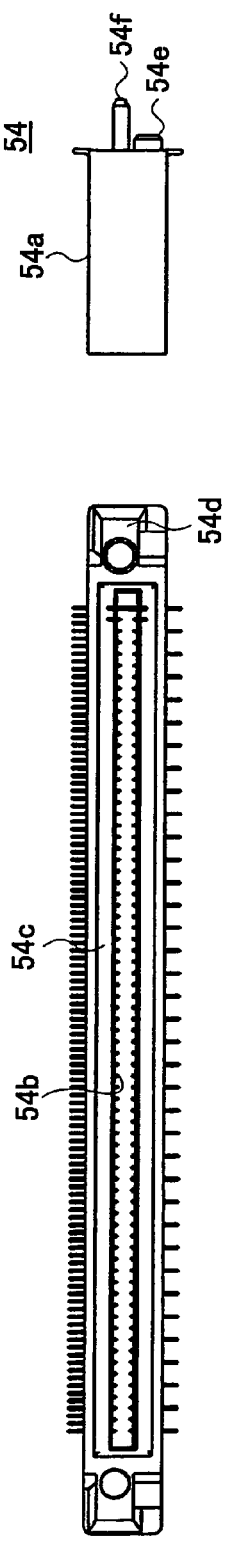
FIG.14A
FIG.14B
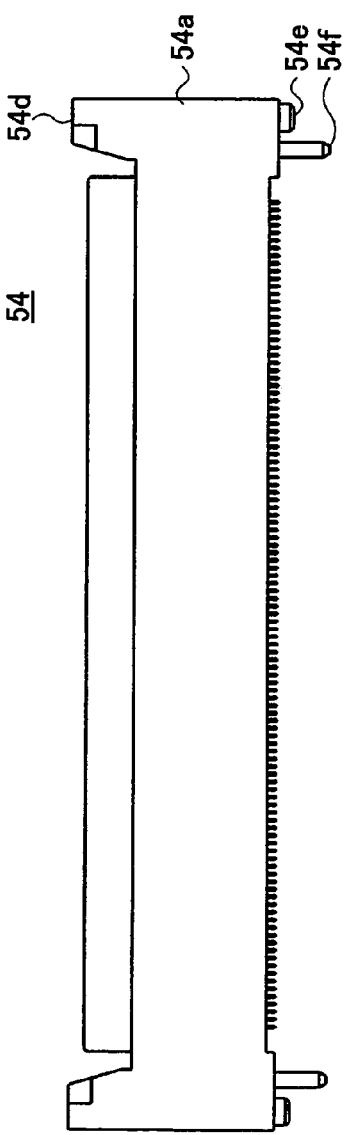
FIG.14C
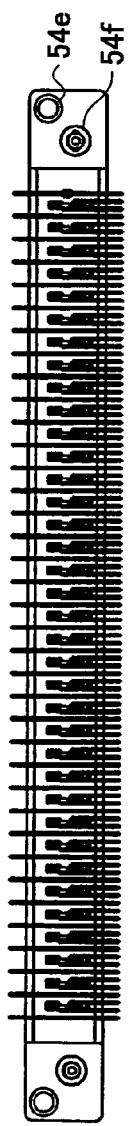

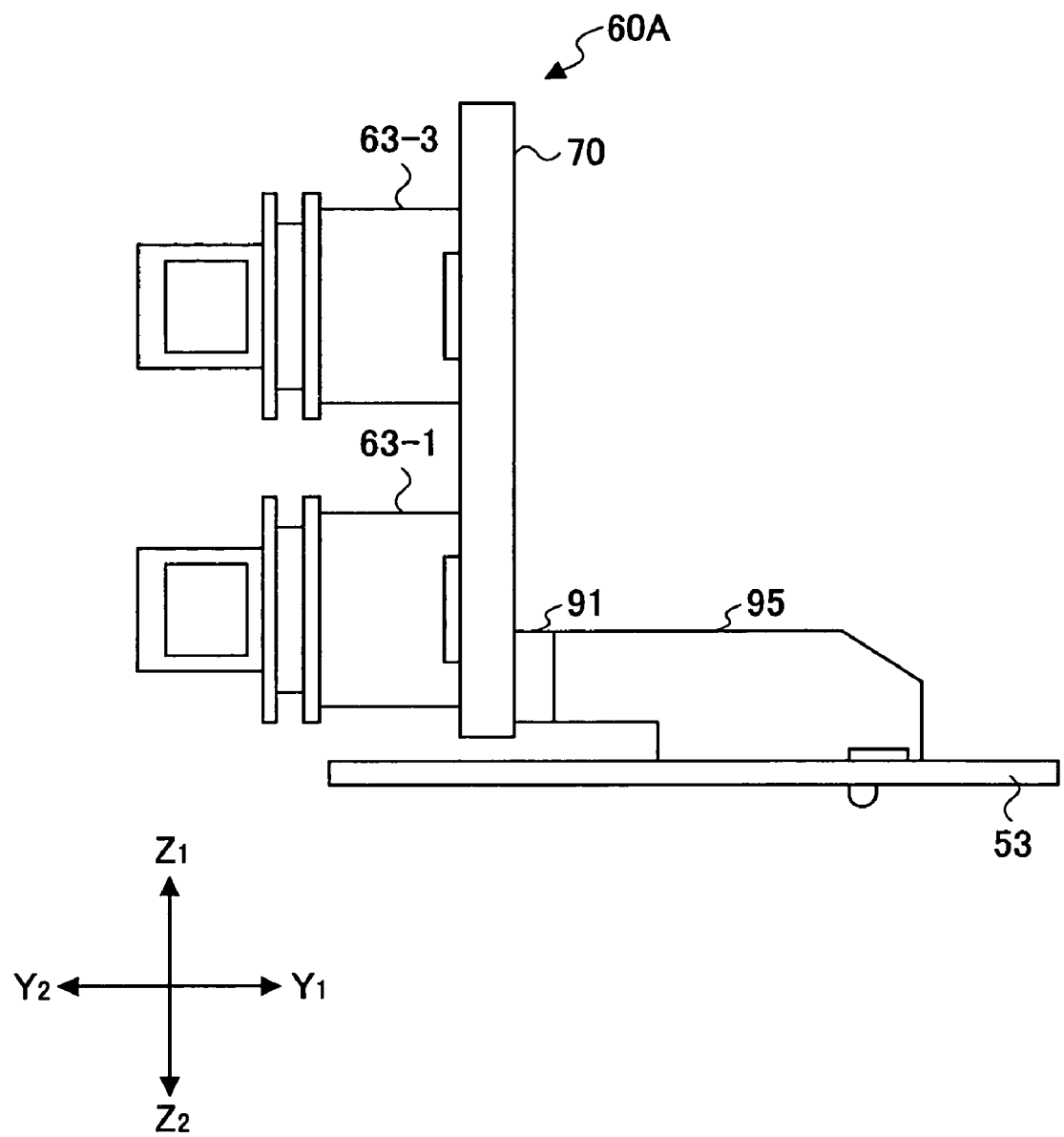

FIG.18
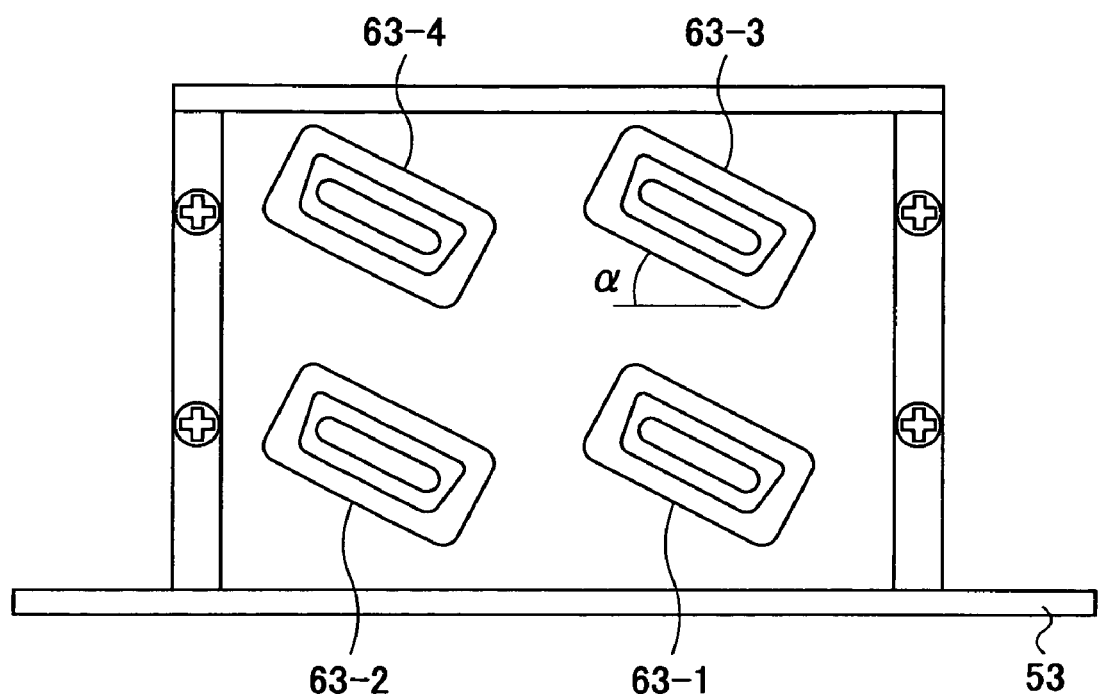
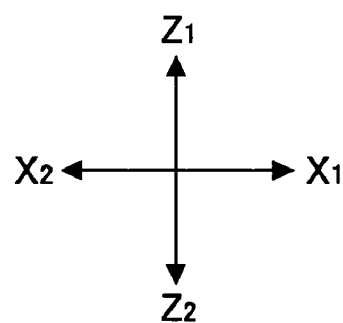

CONNECTOR MODULE

BACKGROUND OF THE INVENTION

1. Field of the Invention

The present invention relates to a connector module embedded into a server and a router, which server and router can be easily designed, constructed, and repaired, for example.

2. Description of the Related Art

FIGS. 1 and 2 are diagrams illustrating portions of a server 10. The server 10 illustrated in these drawings corresponds to a server that includes a relatively large number of substrate side connectors. Specifically, the server 10 includes a chassis 11, two motherboards 20 and 21 that are embedded inside the chassis 11, substrate side connectors 30 that are arranged along the edge of the motherboard 20, and substrate side connectors 31 that are arranged along the edge of the motherboard 21. It is noted that the substrate side connectors 30 and 31 protrude from openings formed at a front panel 12 and are arranged into two rows.

The server 10 may be used by connecting at least one cable side connector 40 to at least one of the substrate side connectors 30 and/or 31.

In the server 10 as is described above, the substrate side connectors 30 and 31 are arranged into two rows, and two motherboards are used, and thereby, elements of a control circuit have to be divided between the two motherboards. With such an arrangement, the design and construction of the server 10 can be quite complicated.

SUMMARY OF THE INVENTION

The present invention has been conceived in response to one or more of the problems describe above, and it provides a connector module that is mounted to a motherboard and is configured to realize connection between a cable side connector and the motherboard, the connector module including:

a printed circuit board;

plural substrate side connectors that are mounted on a front surface of the printed circuit board and arranged into a plurality of rows with differing heights; and a mounting connector that is mounted on a rear surface of the printed circuit board;

wherein at least one of the substrate side connectors is connected to the cable side connector;

the mounting connector is engaged with and connected to a motherboard side connector that is mounted on the motherboard; and the printed circuit board includes a pattern that is configured to realize electrical connection between the substrate side connectors and the mounting connector.

BRIEF DESCRIPTION OF THE DRAWINGS

FIGS. 12A through 12C are projection views of the connector module;

FIGS. 14A through 14D are diagrams illustrating a motherboard side connector;

FIG. 15 is a diagram illustrating a connector module according to a second embodiment of the present invention;

FIG. 18 is a diagram illustrating a connector module according to a fifth embodiment of the present invention.

DESCRIPTION OF THE PREFERRED EMBODIMENTS

In the following, preferred embodiments of the present invention are described with reference to the accompanying drawings.

First Embodiment

Figure 1:
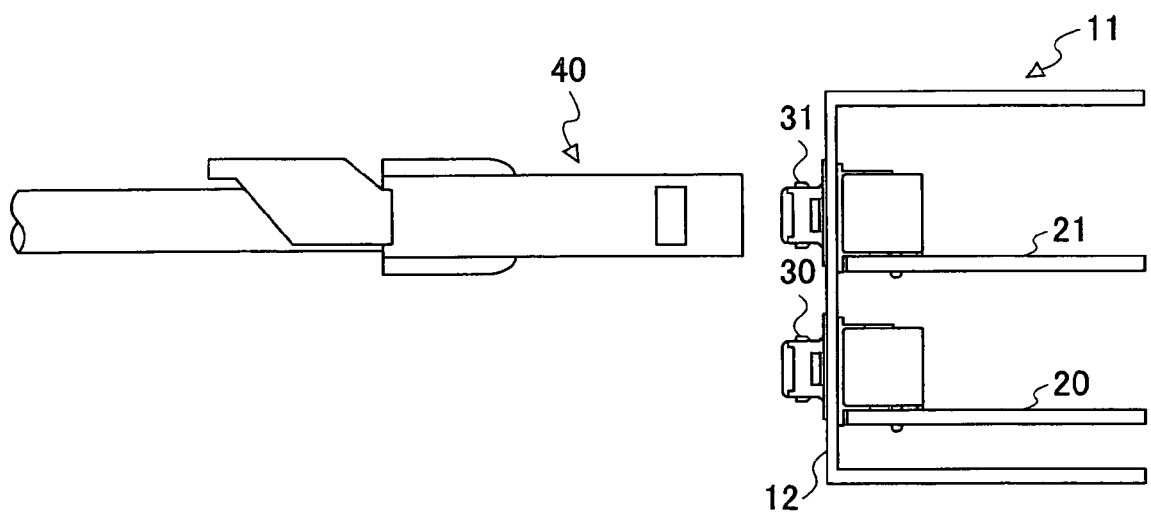
FIG. 1 is a diagram illustrating portions of an exemplary server.
Figure 2:
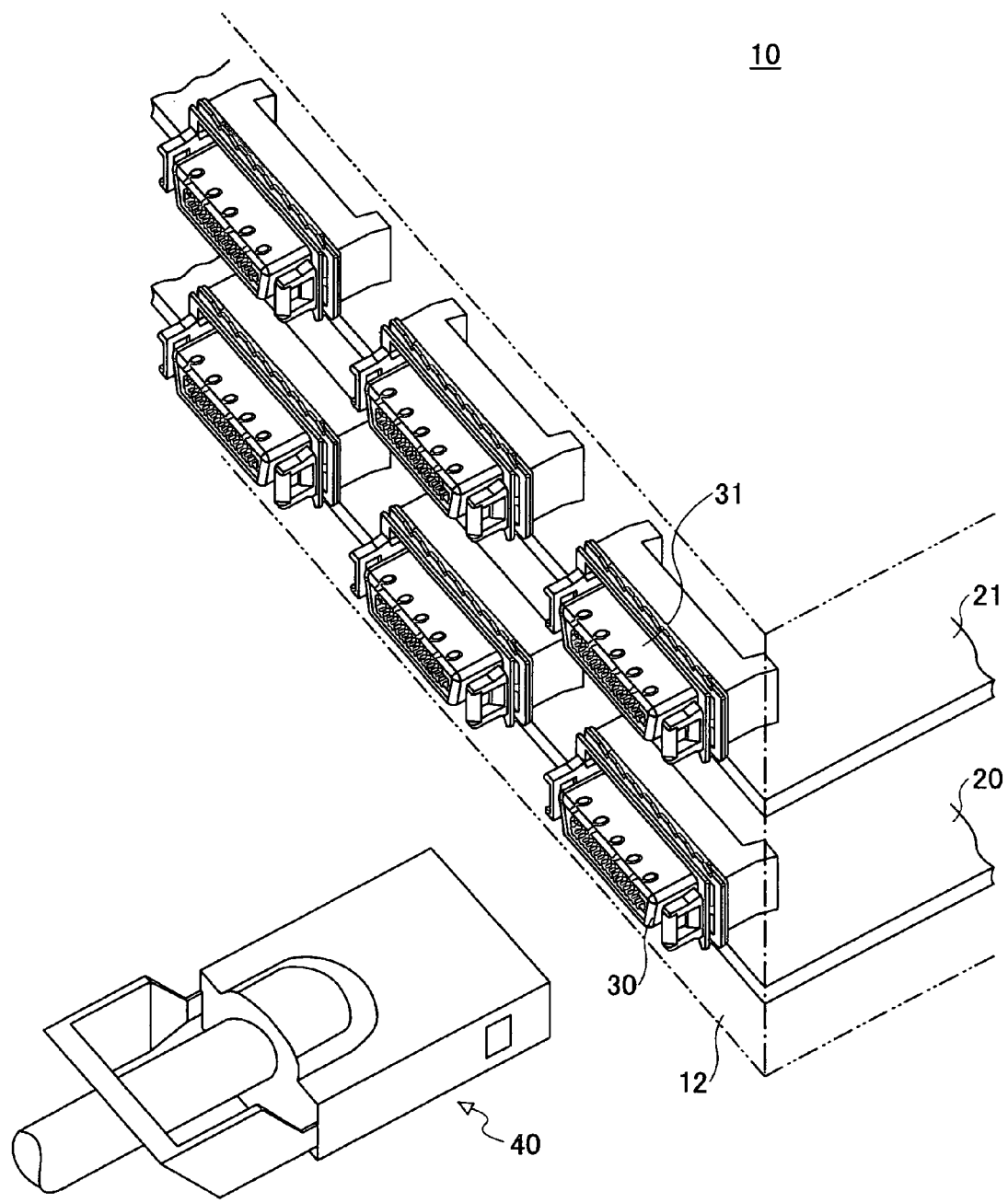
FIG. 2 is a perspective view of the portions of the server shown in FIG. 1.
Figure 3:
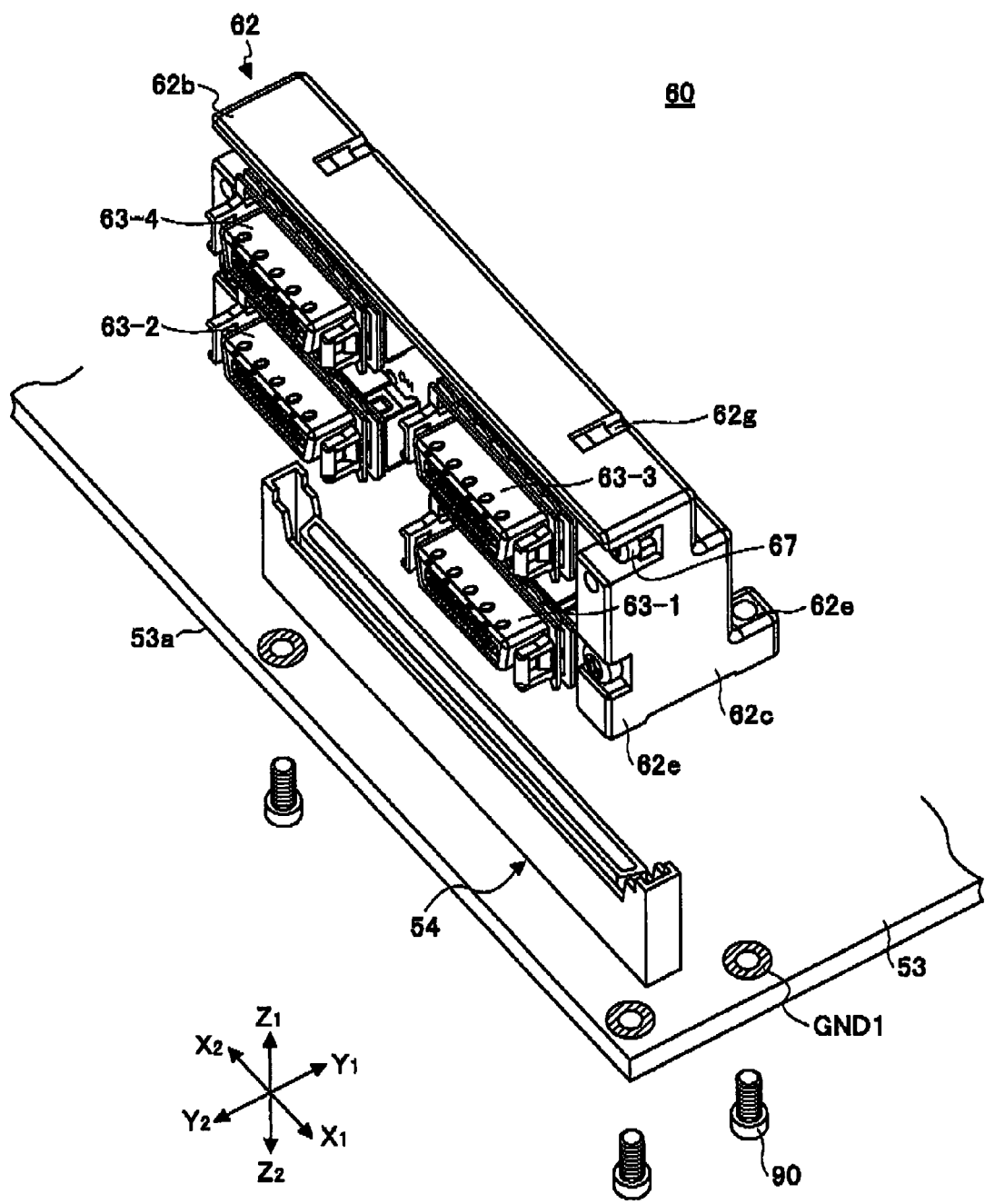
FIG. 3 is a perspective view of a connector module according to a first embodiment of the present invention that is mounted on a motherboard.
Figure 4:
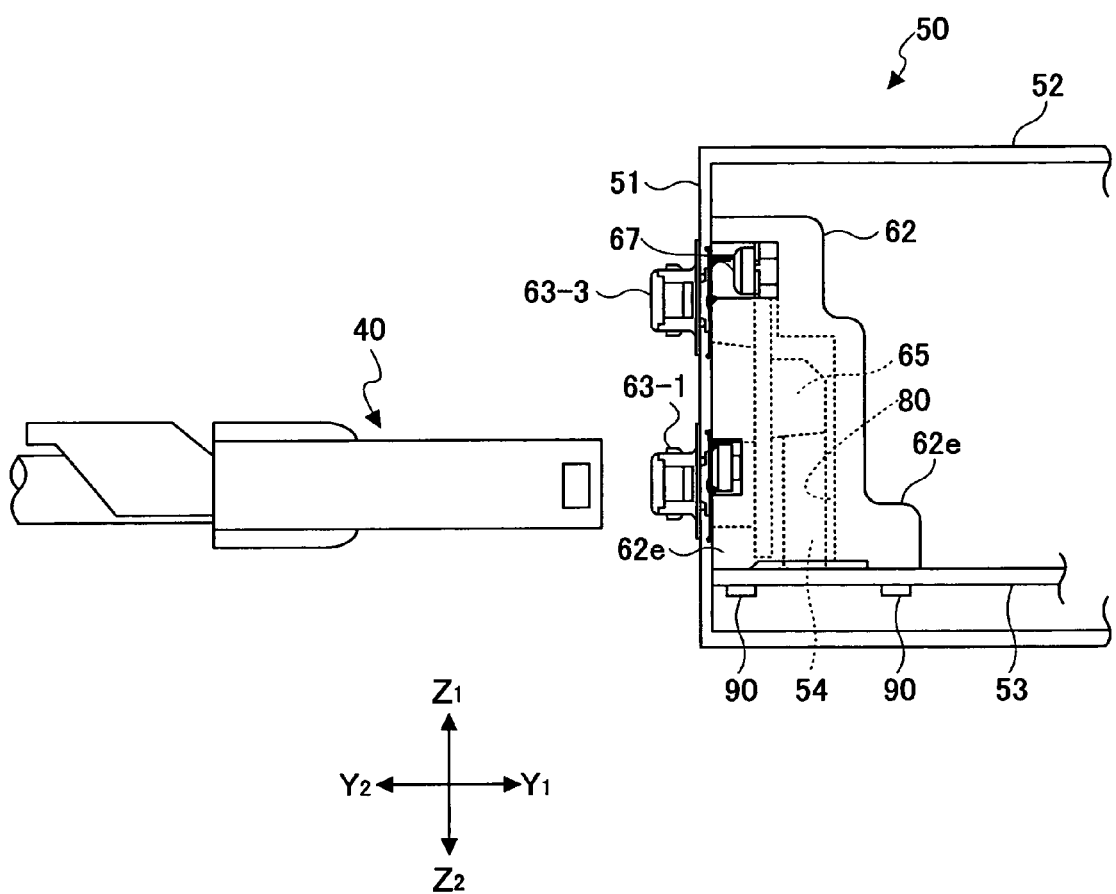
FIG. 4 is a diagram illustrating portions of a server that uses the connector module shown in FIG. 3.
Figure 5:
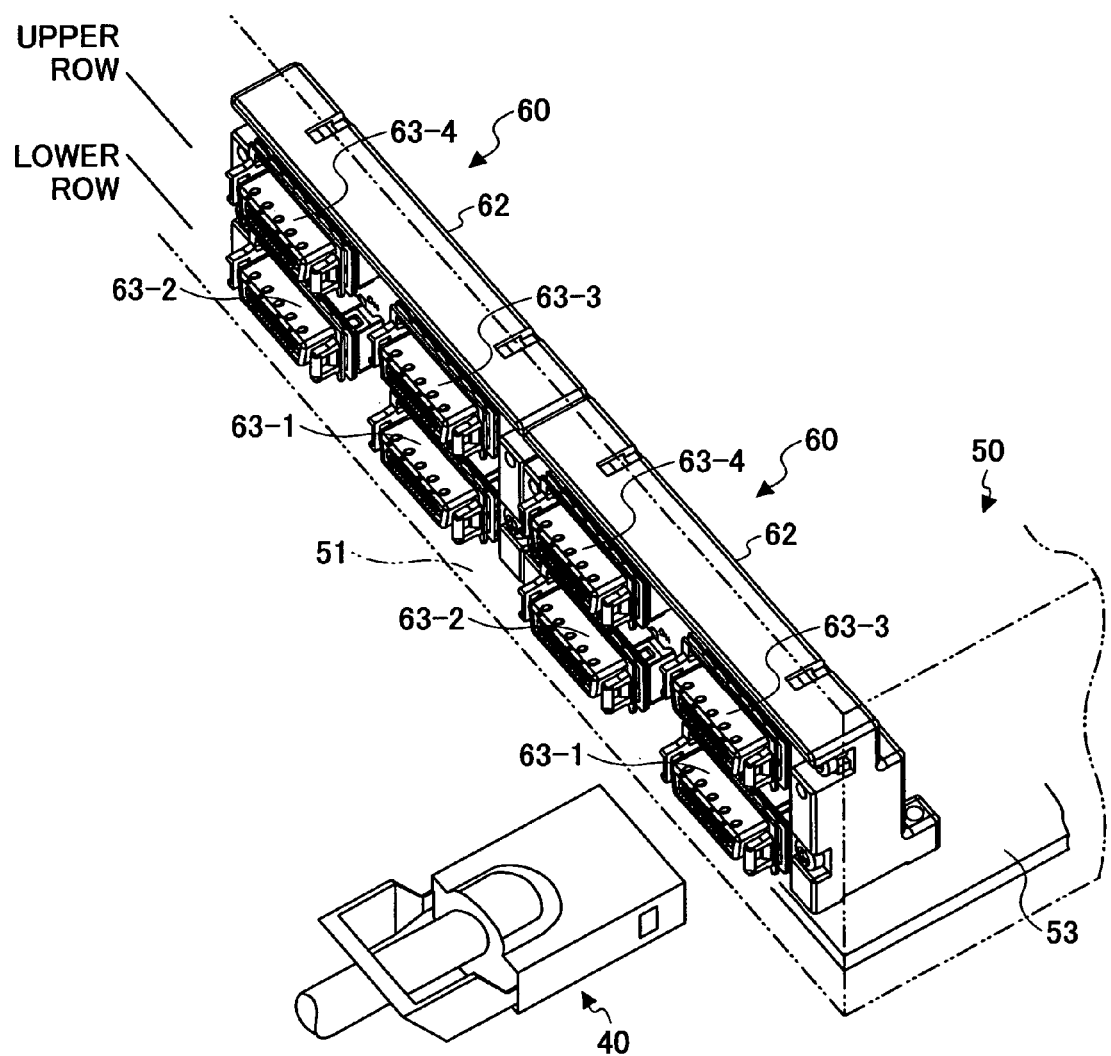
FIG. 5 is a perspective view of the portions shown in FIG. 4.

FIG. 3 is a diagram illustrating a connector module 60 that is mounted on a motherboard 53 according to a first embodiment of the present invention. FIGS. 4 and 5 are diagrams illustrating a server 50 into which the connector module shown in FIG. 3 is embedded.

The server 50 includes plural substrate side connectors 63-1 through 63-4 that protrude from openings 51a and 51b (see FIGS. 6A and 6B) of a front panel 51 and are arranged into a first row and a second row. The server 50 also includes a chassis 52 inside which a single motherboard 53 is arranged. Plural contact modules 60 are arranged along the edge of the motherboard 53 and connected thereto via motherboard side connectors 54. The server 50 may be used by connecting at least one cable side connector 40 to at least one of the substrate side connectors 63-1 through 63-4.

It is noted that in the drawings, directions X1-X2 represent width directions of the server 50 and the connector module 60, directions Y1-Y2 represent length directions of the server 50 and thickness directions of the connector module 60, and directions Z1-Z2 represent the height directions of the server 50 and the connector module 60.

[Overall Structure of Connector Module 60]

Figure 6A:
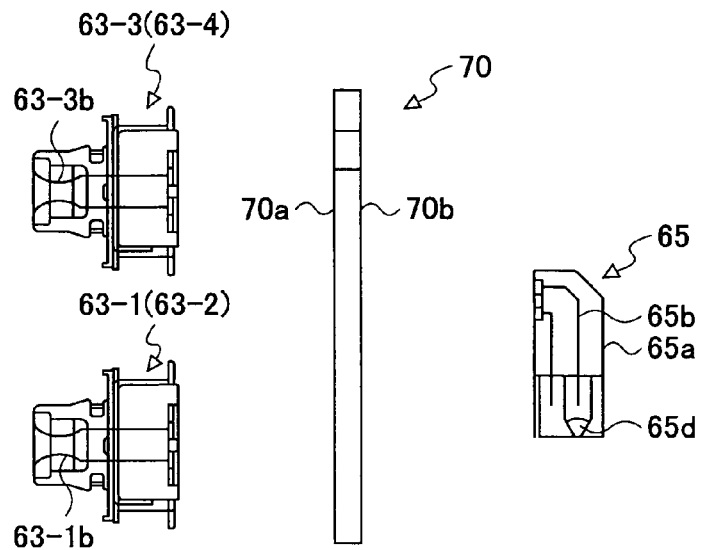
FIGS. 6A and 6B are exploded views of the server and the connector module according to the first embodiment.
Figure 7A:
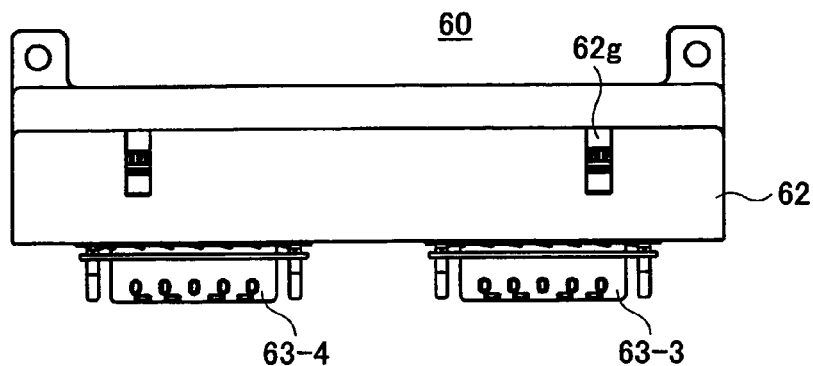
FIGS. 7A through 7C are projection views of the connector module according to the first embodiment.
Figure 7B:
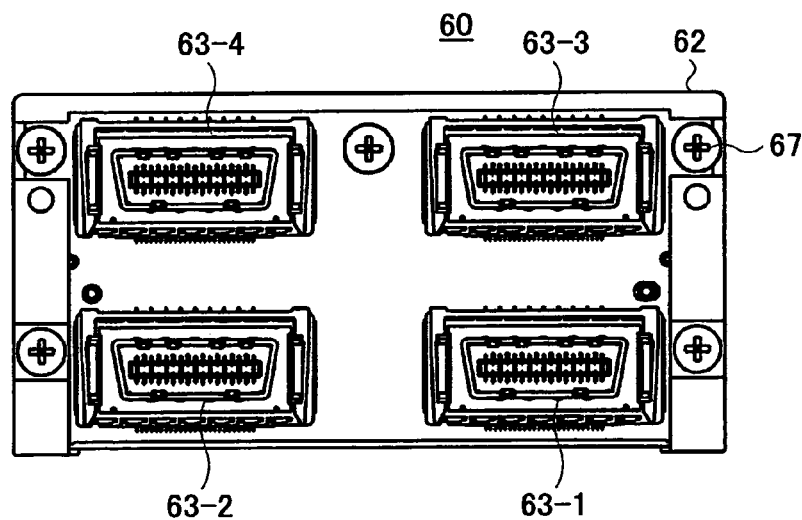
Figure 7C:
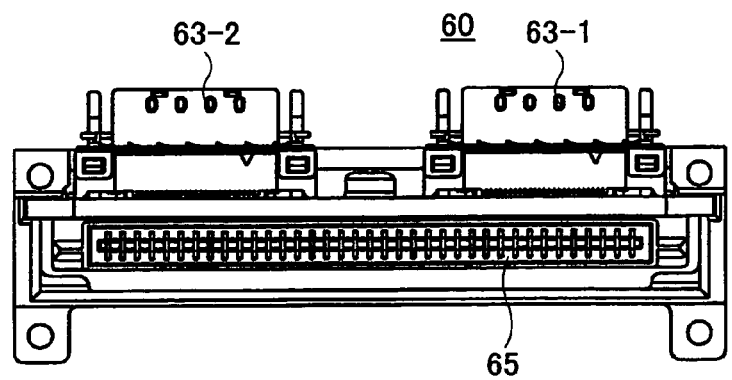
Figure 8:
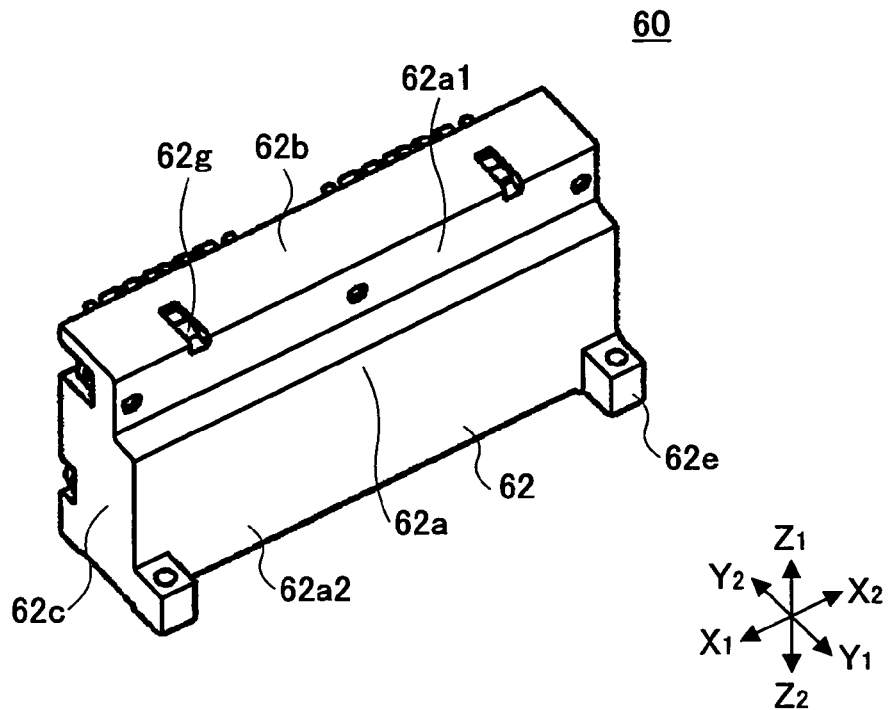
FIG. 8 is a perspective view of the connector module of the first embodiment viewed from the upper rear side.
Figure 9:
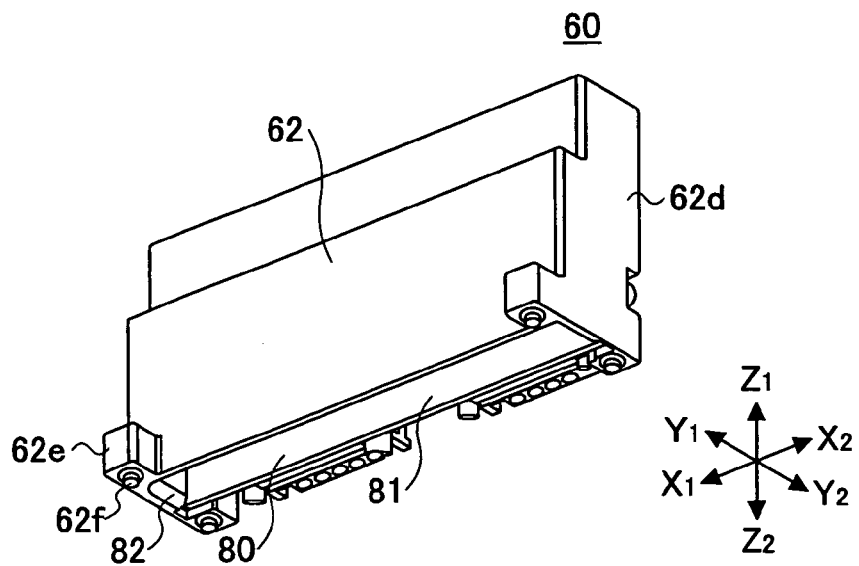
FIG. 9 is a perspective view of the connector module of the first embodiment viewed from the lower rear side.

FIGS. 6A and 68 are exploded views of portions of the connector module 60 and the server 50. FIGS. 7A through 7C are projection views of the connector module 60. FIGS. 8 and 9 are rear side views of the connector module 60.

The connector module 60 includes four substrate side connectors 63-1 through 63-4 that are arranged into a matrix at its front side, and a mounting connector 65 arranged at its rear side. The connector module 60 is mounted on the motherboard 53 by engaging the mounting connector 65 with the motherboard side connector 54.

According to the present embodiment, plural connector modules 60 are mounted on the motherboard 53 in a manner such that the substrate side connectors 63-1 through 63-4 of the connector modules 60 are arranged into two rows along the edge of the motherboard 53.

Also, according to the present embodiment, the connector module 60 may be detached from the motherboard 53 when one or more of the substrate side connectors 63-1 through 63-4 become defective.

[Connector Module Main Body 61]

Figure 10:
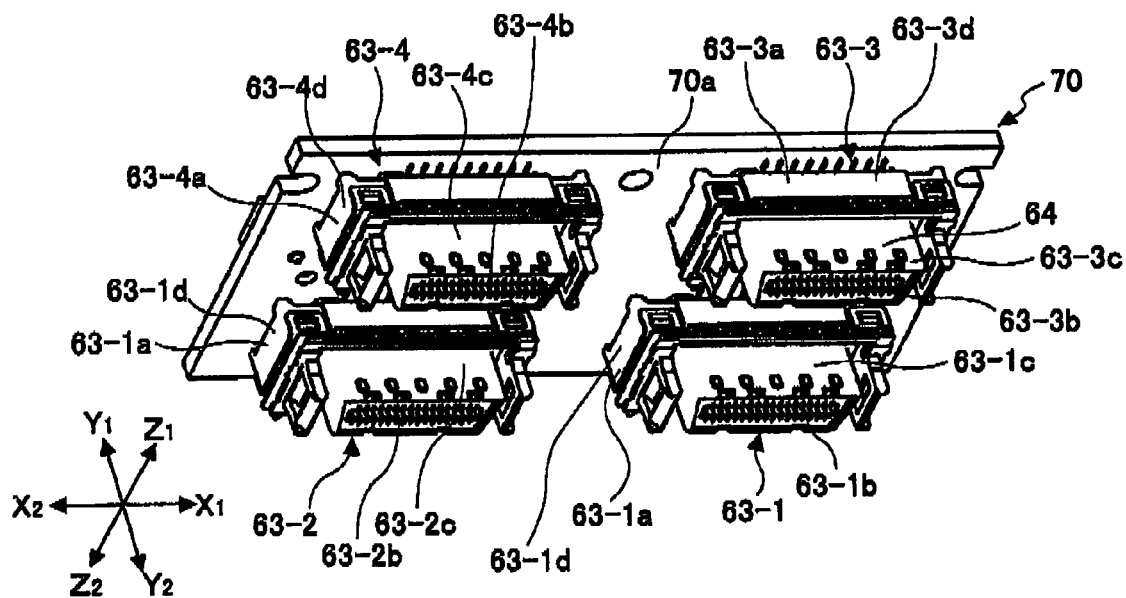
FIG. 10 is a perspective view of a connector module main body viewed from the front side.
Figure 11:
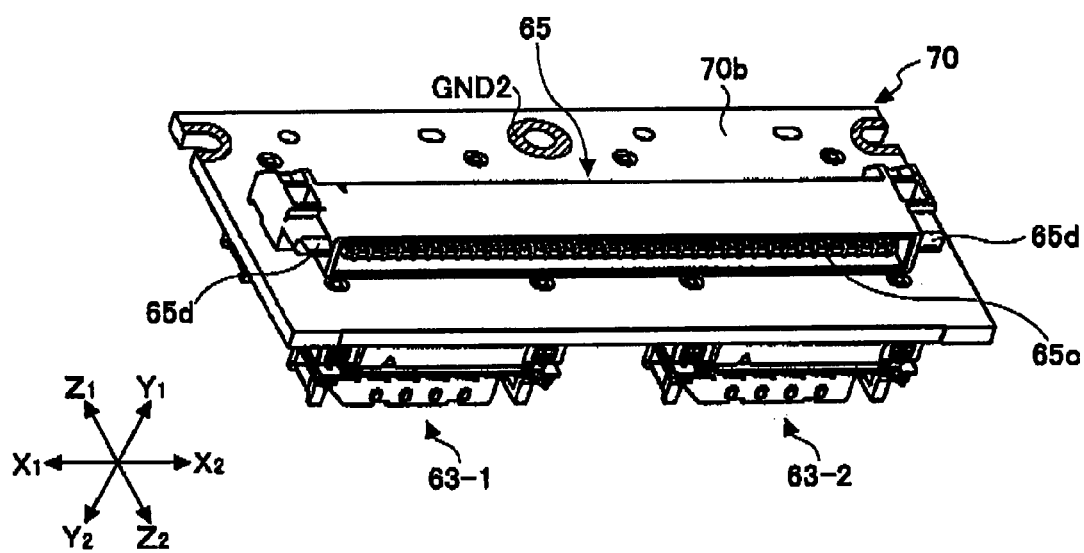
FIG. 11 is a perspective view of the connector module main body viewed from the rear side.

FIG. 10 is a perspective view of a connector module main body 61 viewed from the front side; FIG. 11 is a perspective view of the connector module main body 61 viewed from the rear side; FIGS. 12A through 12C are projection views of the connector module main body 61.

Figure 6B:
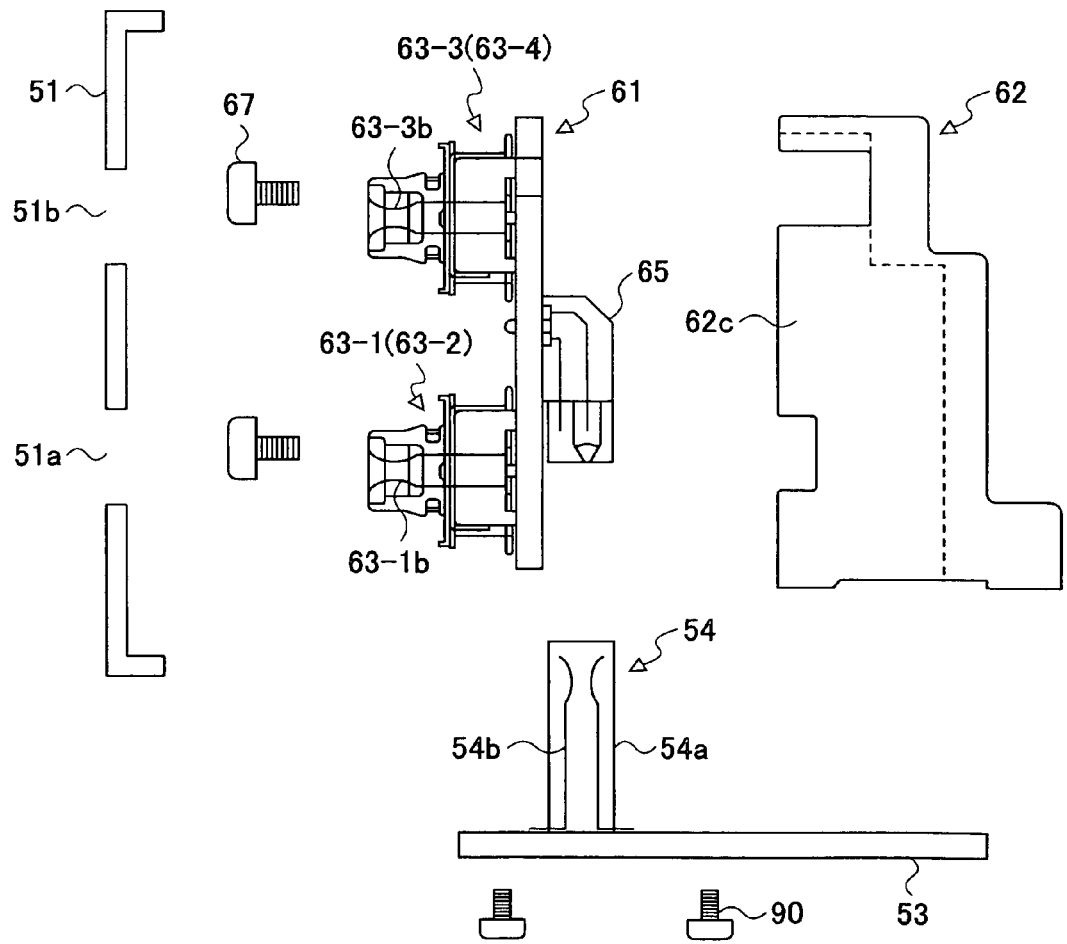

As is shown FIGS. 6A and 6B, the connector module main body 61 includes a printed circuit board 70 having a front side 70a and a back side 70b, the substrate side connectors 63-1 through 63-4 that are arranged into a matrix at the front side 70a of the printed circuit board 70, and the mounting connector 65 that is mounted at the rear side 70b of the printed circuit board 70.

The printed circuit board 70 is described in detail below with reference to FIGS. 13A and 13B. It is noted that the size of the printed circuit board 70 is set such that the four substrate connectors 63-1 through 63-4 may be arranged into a matrix on the printed circuit board 70. On the front side 70a of the printed circuit board 70, substrate side connector mounting portions 71 through 74 are arranged into a matrix for mounting the substrate side connectors 63-1 through 63-4, respectively. At the back side 70b of the printed circuit board 70, a mounting connector mounting portion 75 is arranged along a center line.

Figure 13B:
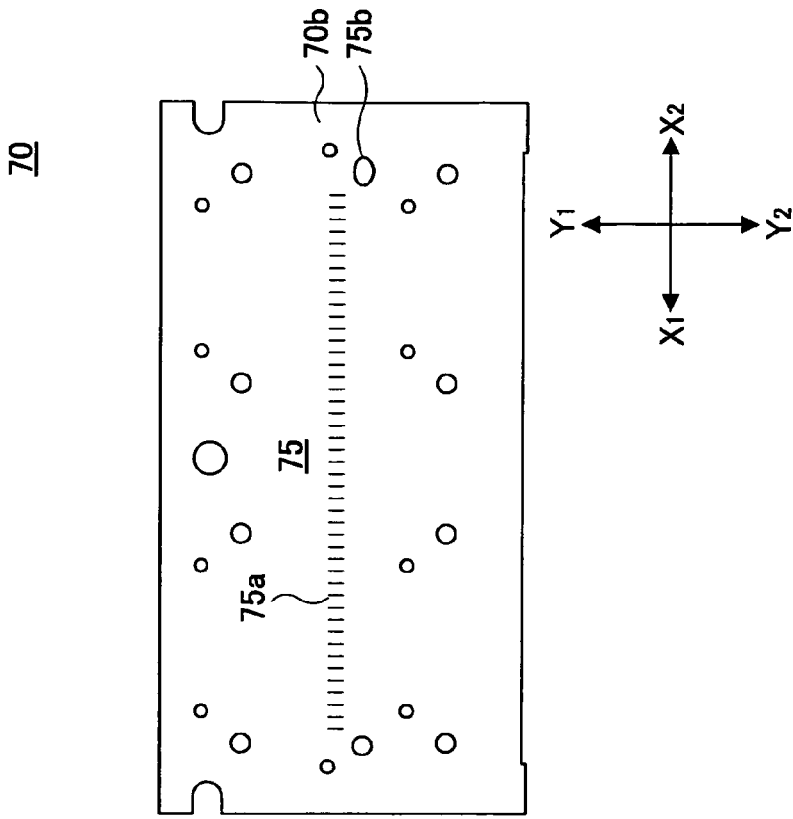
FIGS. 13A and 13B are diagrams illustrating a printed circuit board.
Figure 13A:
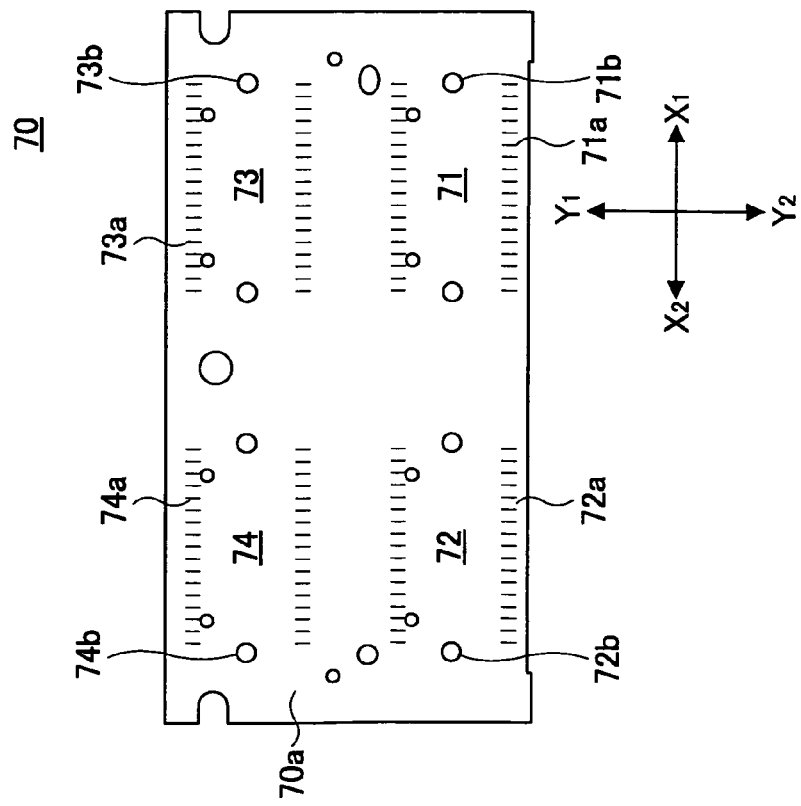

As is shown in FIG. 13A, the mounting portions 71 through 74 are portions extending in the X (X1-X2) directions. The mounting portions 71 through 74 include pads 71a through 74a that are aligned into rows extending in the X directions, and positioning holes 71b through 74b that are arranged at the two X direction side edges of the mounting portions 71 through 74, respectively.

As is shown in FIG. 13B, the mounting portion 75 is a portion extending in the X directions that includes pads 75a aligned into a row extending in the X directions, and positioning holes 75b that are arranged at the X direction side edges of the mounting portion 75. According to the present embodiment, the number of pads 75a corresponds to the total number of pads 71a through 74a.

It is noted that the printed circuit board 70 may also include a wiring pattern, a via, and/or a ground pattern (not shown), for example, that may be used for realizing electrical connection between the pads 71a through 74a of the mounting portions 71 through 74 and the pads 75a of the mounting portion 75.

As is shown in FIGS. 6A and 6B, 10, 12A, and 12B, the substrate side connectors 63-1 through 63-4 include insulative main bodies 63-1a through 63-4a; contacts 63-1b through 63-4b that are arranged at the main bodies 63-1a through 63-4a, respectively, to realize parallel transmission; and engaging portions 63-1c through 63-4c that are covered by shield covers 64 and are situated at the tip portions of the main bodies 63-1a through 63-4a, respectively (see FIG. 10). The substrate side connectors 63-1 through 63-4 are perpendicularly mounted with respect to the printed circuit board 70. The substrate side connectors 63-I through 63-4 are mounted to the mounting portions 71 through 74, respectively, by fitting protrusions (not shown) of the main bodies 63-1a through 63-4a into the positioning holes 71b through 74b, respectively, and soldering the contacts 63-1b through 63-4b to the pads 71a through 74a, respectively. Also, it is noted that the substrate side connectors 63-1 through 63-4 include portions 63-1d through 63-4d that are positioned at the base of the main bodies 63-1a through 63-4a, respectively (see FIG. 10).

Referring to FIG. 12A, line XL1 and XL2 extend in the X directions and are set apart from each other by distance A. Line YL1 and YL2 extend in the Y (Y1-Y2) directions and are set apart from each other by distance B. It is noted that upon equally dividing the longer side length of the printed circuit board 70 into four sections from the X2 side to the X1 side, line YL1 may be positioned around division point 1/4, and line YL2 may be positioned around division point 3/4. Also, upon equally dividing the shorter side length of the printed circuit board 70 into five sections from the Z2 side to the Z1 side, line XL1 may be positioned around division point 1/5 and line XL2 may be positioned around division point 4/5.

According to the present embodiment, the substrate side connectors 63-1 and 63-2 are arranged along line XL1, and the substrate connectors 63-3 and 63-4 are arranged along line XL2 with respect to the X directions. The substrate side connectors 63-1 and 63-3 are arranged along line YL1, and the substrate side connectors 63-2 and 63-4 are arranged along line YL2 with respect to the Y directions.

As is shown in FIGS. 6A and 6B, 11, 12B, and 12C, the mounting connector 65, as an embodiment of an engagement connection unit, has a length that is approximately equal to the length of the printed circuit board 70. The mounting connector 65 includes an insulative main body 65a, and contacts 65b that are arranged at the main body 65a to realize parallel transmission. According to the present embodiment, the mounting connector 65 corresponds to a right angle connector that is arranged to be parallel to the printed circuit board 70. It is noted that the number of the contacts 65b is arranged to correspond to the total number of the contacts 63-1b through 63-4b of the substrate side connectors 63-1 through 63-4. The mounting connector 65 is mounted to the mounting portion 75 by fitting protrusions (not shown) of the main body 65a into the positioning holes 75b and soldering the contacts 65b to the pads 75a.

It is noted that the connector 65 also includes a convex-shaped plug portion 65c that protrudes toward the Z2 direction, and guide protruding portions 65d that protrude in the Z2 direction and are arranged at the two longer side edges of the main body 65a (see FIG. 11).

[Shield Cover Member 62]

As is shown in FIGS. 6A and 6B, 8, and 9, a shield cover member 62 is arranged to cover the rear surface side of the connector module main body 61. The shield cover member 62 may be made of a synthetic resin molded material that is plated with conductive plating, for example. The shield cover member 62 includes a stepped back board portion 62a, an upper board portion 62b, and side board portions 62c and 62d. The back board portion 62a is arranged into a stepped structure including an upper step portion 62a1 and a lower step portion 62a2.

The shield cover member 62 and the connector module main body 61 are bound to form an integrated structure by arranging the upper step portion 62a1 to come into contact with the printed circuit board 70 and fixing the printed circuit board 70 to the upper step portion 62a1 using screws 67 inserted from the Y2 side at plural locations. In this way, the shield cover member 62 is mounted to the connector module main body 61.

When the shield cover member 62 is mounted to the connector module main body 61, the back board portion 62a covers the rear surface side of the connector module main body 61 to shield the mounting connector 65, and the upper board portion 62b and the side board portions 62c and 62d extend beyond the position of the printed circuit board 70 in the Y2 direction (see FIG. 6). Specifically, the side board portion 62c covers the side surfaces of portions 63-1d and 63-3d at the base of the substrate side connectors 63-1 and 63-3, the side board portion 62-2d and 63-4d at the base of the substrate side connectors 63-2 and 63-4, and the upper board portion 62b covers the upper surfaces of the portions 63-1d and 63-4d at the base of the substrate side connectors 63-1 and 63-4. In this way, when the connector module 60 is embedded into the server 50, the connector module main body 61 may be adequately shielded by the shield cover member 62. It is noted that in the present embodiment, the mounting connector 65 is primarily covered by the lower step portion 62a2. Also, the shield cover member 62 is arranged to be in contact with a ground pattern GND2 (illustrated in FIG. 11) of the printed circuit board 70.

As is shown in FIG. 9, at the Z2 side portion of the mounting connector 65, a motherboard side connector space 80 is created. At the Z2 side edge of the motherboard side connector space 80, a rectangular opening 81 is formed, and at the rim of the rectangular opening 81, a sloping connector guide portion 82 is arranged.

As is shown in FIGS. 8 and 9, the shield cover member 62 includes leg portions 62a at its four Z2 side edge corners, and each of the leg portions 62e includes a protruding portion 62f protruding from the Z2 side surface.

Also, as is shown in FIG. 8, the shield cover member 62 has two slits 62g at a region extending over the upper board portion 62b and the upper step portion 62a1. The slits 62g are used for accurately positioning the printed circuit board 70 to the shield cover member 62. Specifically, upon binding the connector module main body 61 and the shield cover member 62 together using screws 67, a jig is inserted into the slits 62g to push down the upper edge portion of the printed circuit board 70 so that the lower edge portion of the printed circuit board 70 may be accurately positioned to the shield cover member 62.

It is noted that the shield cover member may be made of conductive synthetic resin or metal, for example.

[Structure of Motherboard 53]

As is shown in FIGS. 3 and 4, in the present embodiment, a single motherboard 53 is used, and a control circuit is integrated into this motherboard 53. It is noted that plural motherboard side connectors 54 as is illustrated in FIGS. 14A through 14D are positioned perpendicularly with respect to the motherboard 53 at a predetermined pitch along the Y2 side edge 53a of the motherboard 53, the motherboard side connectors 54 being positioned by protruding portions 54e and 54f.

As is shown in FIGS. 3 and 6A and 6B, the motherboard side connector 54 is paired up with the mounting connector 65, and includes contacts 54b that are arranged on an insulative main body 54a to realize parallel transmission. The insulative main body 54a includes a concave-shaped jack portion 54c along the Z1 side, concave-shaped guide portions 54d at the two side ends of the Z1 side, and the protruding portions 54e and 54d for positioning the motherboard side connector 54 at the Z2 side ends.

[Mounting Connector Module 60 to Motherboard 53]

As is shown in FIG. 4, the connector module 60 is mounted to the motherboard 53 by engaging the mounting connector 65 with the motherboard side connector 54 and fixing the leg portions 62e to the motherboard 53 with screws 90 that are inserted from the Z2 side. Also, as is shown in FIG. 5, another connector module 60 is engaged with another motherboard side connector 54 and bound together by screws 90.

According to the present embodiment, four substrate side connectors 63 (i.e., substrate side connectors 63-1 through 63-4) are included in one connector module 60, and plural connector modules 60 are arranged into a row so that the substrate side connectors 63 of the connector modules 60 are arranged into two rows; namely, upper and lower rows (with respect to the Z directions) extending in the X directions.

In such an arrangement, plural connector modules may be prepared beforehand, and the connector modules 60 may be successively mounted to the motherboard 53 by engaging their respective mounting connectors 65 with their corresponding motherboard side connectors 54 and fixing the connector modules 60 using screws 90. In this way, plural substrate side connectors 63 may be arranged into two rows.

It is noted that in the process of engaging and connecting the mounting connector 65 of the connector module 60 with/to the motherboard side connector 54, the opening 81 of the connector module 60 may be engaged with the motherboard side connector 54 in a smooth manner by the connector guides 82, and the guide protruding portions 65d may be guided into the concave-shaped guide portions 54d. In this way, engagement of the mounting connector 65 and the motherboard side connector 54 may be performed smoothly with accuracy.

According to the present embodiment, the leg portions 62e of the shield cover member 62 comes into contact with a ground pattern GND1 (illustrated in FIG. 3) of the motherboard 53 so that the shield cover member 62 may be set to ground potential.

According to the present embodiment, in a case where one or more of the substrate side connectors 63 becomes defective when the server 50 is in use, the connector module 60 including the defective substrate side connector 63 may be replaced whereas the motherboard 53 need not be replaced. Thus, connection maintenance may be facilitated.

Also, in the present embodiment, the motherboard side connector 54 is accommodated within the motherboard side connector space 80 and shielded by the shield cover member 62.

Second Embodiment

In the following, a connector module 60A according to a second embodiment of the present invention is described with reference to FIG. 15. It is noted that in this drawing, components that are identical to those of the connector 60 according to the first embodiment are given the same reference numerals. The connector module 60A according to the present embodiment includes a perpendicular mounting connector 91 that is mounted perpendicularly with respect to the printed circuit board 70 instead of the right angle mounting connector 65 of the connector module 60 according to the first embodiment.

In the present embodiment, a right angle connector 95 is mounted on the motherboard 53.

The connector module 60A is mounted on the motherboard 53 by connecting the mounting connector 91 to the connector 95.

Third Embodiment

Figure 16:
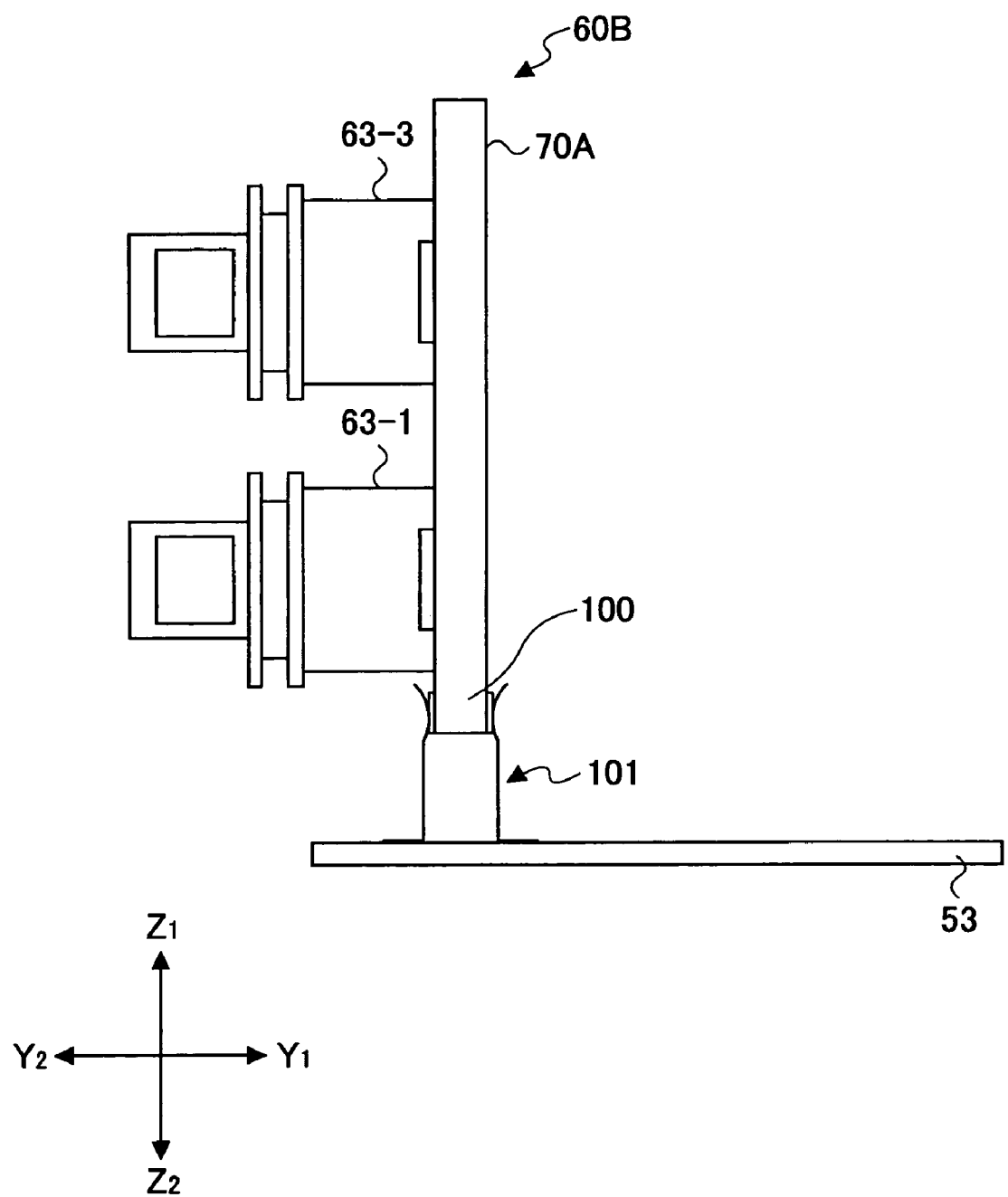
FIG. 16 is a diagram illustrating a connector module according to a third embodiment of the present invention.

In the following, a connector module 60B according to a third embodiment of the present invention is described with reference to FIG. 16. It is noted that in this drawing, components that are identical to those of the connector 60 according to the first embodiment are given the same reference numerals. The connector module 60B according to the present embodiment includes a printed circuit board 70A having a card edge connector portion 100 formed at its edge instead of using the printed circuit board 70 and the mounting connector 65 as in the connector module 60 according to the first embodiment.

In the present embodiment, a card edge connector 101 is mounted on the motherboard 53.

The connector module 60B is mounted on the motherboard 53 by connecting the card edge connector portion 100 to the card edge connector 101.

Fourth Embodiment

Figure 17:
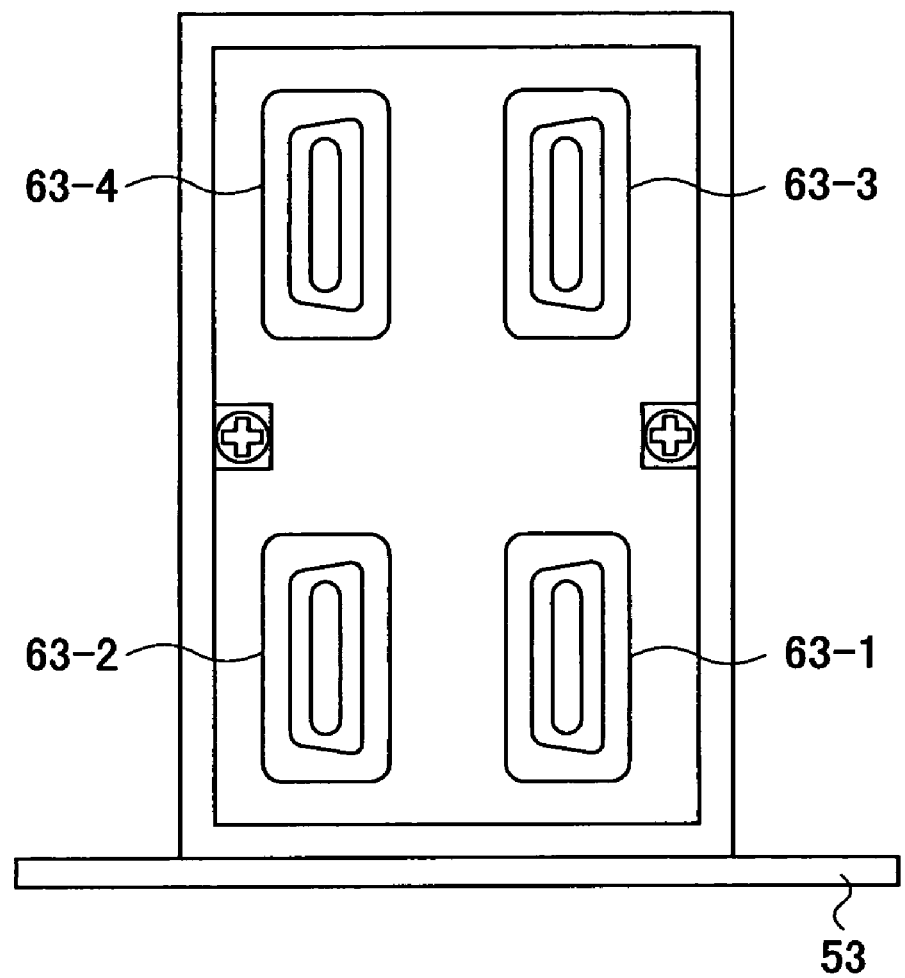
FIG. 17 is a diagram illustrating a connector module according to a fourth embodiment of the present invention.

In the following, a connector module 60C according to a fourth embodiment of the present invention is described with reference to FIG. 17. It is noted that in this drawing, components that are identical to those of the connector 60 according to the first embodiment are given the same reference numerals. In the connector module 60C according to the present embodiment, the substrate side connectors 63-1 through 63-4 are arranged such that their longer sides extend in the Z direction (in perpendicular directions with respect to the motherboard 53).

Fifth Embodiment

In the following, a connector module 60D according to a fifth embodiment of the present invention is described with reference to FIG. 18. It is noted that in this drawing, components that are identical to those of the connector 60 according to the first embodiment are given the same reference numerals. In the connector module 60D according to the present embodiment, the substrate side connectors 63-1 through 63-4 are arranged such that their longer sides are slanted by a predetermined angle $\alpha$ with respect to the X directions (i.e., parallel directions with respect to the motherboard 53).

Sixth Embodiment

Figure 19:
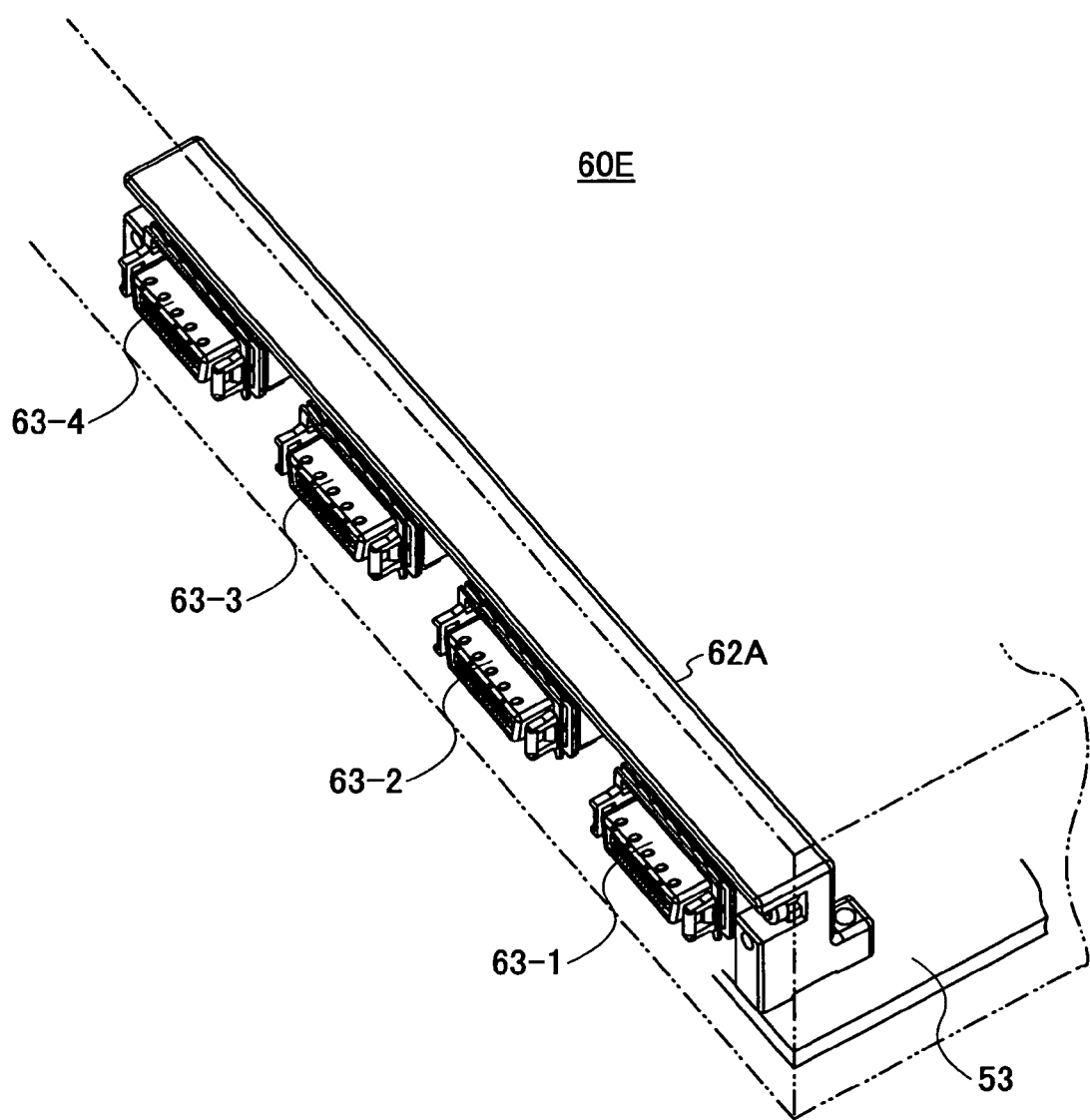
FIG. 19 is a diagram illustrating a connector module according to a sixth embodiment of the present invention.

In the following, a connector 60E according to a sixth embodiment of the present invention is described with reference to FIG. 19. It is noted that in this drawing, components that are identical to those of the connector 60 according to the first embodiment are given the same reference numerals. In the connector module 60E according to the present embodiment, the substrate side connectors 63-1 through 63-4 are arranged into one row extending in the X directions.

The connector module 60E is mounted to the motherboard 53 by connecting the respective substrate connectors 63-1 through 63-4 to their corresponding motherboard side connectors 54.

According to one or more of the embodiments described above, the substrate side connectors are arranged into plural rows with differing heights (e.g., upper row and lower row), and connection may be adequately realized using a single motherboard. In this way, design and construction of a server maybe simplified.

Also, according to one or more of the embodiments described above, when one or more of the substrate side connectors become defective, a connector module including the defective substrate side connector may be replaced with a new connector module whereas the motherboard need not be replaced, and thereby, connection maintenance may be facilitated.

Further, it is noted that the present invention is not limited to these embodiments, and variations and modifications may be made without departing from the scope of the present invention.

What is claimed is:

1. A connector module, comprising:
  a printed circuit board having a front face and a rear face;
  a plurality of substrate side connectors identically structured, arranged into at least two rows and disposed on the front face of the printed circuit board, each substrate side connector to accommodate a cable side connector in a direction substantially perpendicular to the printed circuit board;
  an engagement connection unit disposed on the rear face of the printed circuit board, the engagement connection unit together with a corresponding motherboard side connector disposed on a motherboard to connect to the printed circuit board to the motherboard such that the printed circuit board is substantially perpendicular to the motherboard, each contact of the engagement connection unit being connected to a corresponding contact of the plurality of substrate side connectors through wiring provided on the printed circuit board; and
  a shield cover member provided at a rear face side of the printed circuit board, the shield cover member having a first stepped portion covering a first portion of the rear face of the printed circuit board and a second stepped portion covering a second portion of the rear face of the printed circuit board, the engagement connection unit being covered by the second stepped portion, the shield cover member being detachably mounted on a surface of the printed circuit board with at least four screws, the four screws being directly mounted on the printed circuit board.

2. A connector module that is mounted on a motherboard and is configured to realize connection between a cable side connector and the motherboard, the connector module comprising:
  a shield cover member made of conductive material and including a back board portion, an upper board portion, a plurality of side board portions, and a plurality of leg portions, said shield cover member being detachably mounted on a surface of the motherboard by fixing the leg portions onto the motherboard with at least four first screws, the four screws being directly mounted on the motherboard;
  a connector module main body that is accommodated within the shield cover member, said connector module including:
  a printed circuit board including a pattern and being arranged substantially perpendicular to the surface of the motherboard, a rear face of said printed circuit board being covered by the back board portion of the shield cover member, which is fixed to the printed circuit board by a plurality of second screws and is connected to a ground pattern of the printed circuit board and a ground pattern of the motherboard, at least four identically structured substrate side connectors configured to be connected to the cable side connector, said substrate side connectors being mounted on a front surface of the printed circuit board and arranged into at least two rows, said front surface of the printed circuit board proximate to an open front of the shield cover member formed by the upper board portion and side board portions, and an engagement connection unit that is electrically connected to the substrate side connectors via the pattern of the printed circuit board, said engagement connection unit being covered by the back board portion of said shield cover member;

wherein the connector module main body is mounted on the surface of the motherboard by connecting the engagement connection unit to a motherboard side connector arranged on the surface of the motherboard; and at least two of the first screws are offset from the remaining first screws in a direction in which the substrate side connectors receive the cable side connector.

3. The connector module as claimed in claim 2, wherein the engagement connection unit comprises a right angle mounting connector.

4. The connector module as claimed in claim 2, wherein the connector module main body includes four of the substrate side connectors that are arranged into a lower row and an upper row.

5. The connector module as claimed in claim 2, wherein the engagement connection unit corresponds to a mounting connector that is mounted on a rear surface of the printed circuit board.

6. The connector module as claimed in claim 2, wherein the engagement connection unit corresponds to a card edge connection portion of the printed circuit board.

7. The connector module as claimed in claim 2, wherein the shield cover member includes an extending portion extending toward the front surface of the printed circuit board which extending portion covers a side surface and an upper surface of at least one of the substrate side connectors, and a leg portion for fixing the shield cover member to the motherboard.

8. A connector module that is mounted on a motherboard and is configured to realize connection between a cable side connector and the motherboard, the connector module comprising:

a shield cover member made of conductive material and including a back board portion, an upper board portion, a plurality of side board portions, and a plurality of leg portions, said shield cover member being detachably mounted on a surface of the motherboard by fixing the leg portions onto the motherboard with at least four first screws, the four screws being directly mounted on the motherboard;

a printed circuit board, arranged substantially perpendicular to the surface of the motherboard, including a rear face covered by the back board portion of the shield cover member, which is fixed to the printed circuit board by a plurality of second screws and is connected to a ground pattern of the printed circuit board and a ground pattern of the motherboard;

at least four identically structured substrate side connectors configured to be connected to the cable side connector, said substrate side connectors being mounted on a front surface of the printed circuit board and arranged into at least two rows, said front surface of the printed circuit board proximate to an open front of the shield cover member formed by the upper board portion and side board portions; and a mounting connector that is mounted on a rear surface of the printed circuit board and covered by the back board portion of the shield cover member;

wherein at least one of the substrate side connectors is connected to the cable side connector;

the mounting connector is engaged with and connected to a motherboard side connector that is mounted on the surface of the motherboard;

at least two of the first screws are offset from the remaining first screws in a direction in which the cable side connector is connected to the at least one of the substrate side connectors; and the printed circuit board includes a pattern that is configured to realize electrical connection between the substrate side connectors and the mounting connector.

9. The connector module as claimed in claim 8, wherein said shield cover member is configured to cover the rear surface of the printed circuit board and the mounting connector, the shield cover member including an extending portion extending toward the front surface of the printed circuit board which extending portion covers a side surface and an upper surface of at least one of the substrate side connectors, and a leg portion for fixing the shield cover member to the motherboard.

10. A device comprising:

a motherboard including a motherboard side connector that is arranged at an edge portion of the mother board; and a connector module that is mounted on the motherboard and is configured to realize connection between a cable side connector and the motherboard, the connector module including:

a shield cover member made of conductive material and including a back board portion, an upper board portion, a plurality of side board portions, and a plurality of leg portions, said shield cover member being detachably mounted on a surface of the motherboard by fixing the leg portions onto the motherboard with at least four first screws, the four first screws being directly mounted on the motherboard;

a printed circuit board, arranged substantially perpendicular to the surface of the motherboard, including a rear face covered by the backboard portion of the shield cover member, which is fixed to the printed circuit board by a plurality of second screws and is connected to a ground pattern of the printed circuit board and a ground pattern of the motherboard, at least four identically structured substrate side connectors configured to be connected to the cable side connector, said substrate side connectors being mounted on a front surface of the printed circuit board and arranged into at least two rows, said front surface of the printed circuit board proximate to an open front of the shield cover member formed by the upper board portion and side board portions, and a mounting connector that is mounted on a rear surface of the printed circuit board and covered by the back board portion of the shield cover member, wherein at least one of the substrate side connectors is connected to the cable side connector, the mounting connector is engaged with and connected to the motherboard side connector that is mounted on the surface of the motherboard, at least two of the first screws are offset from the remaining first screws in a direction in which the cable side connector is connected to the at least one of the substrate side connectors, and the printed circuit board includes a pattern that is configured to realize electrical connection between the substrate side connectors and the mounting connector.

11. A connector module that is mounted on a motherboard and is configured to realize connection between a cable side connector and the motherboard, the connector module comprising:

- a shield cover member made of conductive material and including a back board portion, an upper board portion, a plurality of side board portions, and a plurality of leg portions, said shield cover member being detachably mounted on a surface of the motherboard by fixing the leg portions onto the motherboard with at least four screws, the four screws being directly mounted on the motherboard;
- a connector module main body provided within the shield cover member and including printed circuit board including a pattern, and being arranged substantially perpendicular to the surface of the motherboard, a rear face of said printed circuit board being covered by the backboard portion of the shield cover member, which is fixed to the printed circuit board by a plurality of second screws, and is connected to a ground pattern of the printed circuit board and a ground pattern of the motherboard; and
- at least four identically structured substrate side connectors configured to be connected to the cable side connector, said substrate side connectors being mounted on a front surface of the printed circuit board and arranged into at least two rows, said front surface of the printed circuit board proximate to an open front of the shield cover member formed by the upper board portion and side board portions; wherein
- at least two of the first screws are offset from the remaining first screws in a direction in which the substrate side connectors receive the cable side connector.

* * * * *